United States Patent [19]
Ogle

[11] Patent Number: 5,944,942
[45] Date of Patent: Aug. 31, 1999

[54] VARYING MULTIPOLE PLASMA SOURCE

[76] Inventor: John Seldon Ogle, 1472 Pashote Ct., Milpitas, Calif. 95035

[21] Appl. No.: 09/034,727
[22] Filed: Mar. 4, 1998
[51] Int. Cl.⁶ .................................................. C23C 16/00
[52] U.S. Cl. .................................. 156/345; 118/723 MA; 118/723 I; 118/723 E
[58] Field of Search .............................. 118/723; 156/345

[56] References Cited

U.S. PATENT DOCUMENTS

| | | | |
|---|---|---|---|
| 4,871,421 | 10/1989 | Ogle | 156/643 |
| 5,261,962 | 11/1993 | Hamamoto | 118/723 |
| 5,435,881 | 7/1995 | Ogle | 156/345 |
| 5,589,737 | 12/1996 | Barnes | 315/111.21 |
| 5,795,429 | 9/1998 | Ishii | 156/345 |

Primary Examiner—Bruce Breneman
Assistant Examiner—Erin Fieler

[57] ABSTRACT

Gas diffuser bolt (35) is used to improve process gas flow from near the center of process chamber (40) across workpiece (58) to exhaust ports near the periphery of process chamber (40), process nonuniformity is improved by adjusting the vertical position of each varying magnetic pole (10) relative to two-pole rounded oblong dielectric window (22), differential driving of metal voltage reference plate (18) and workpiece electrode (60) reduce the voltage between the plasma and process chamber (40), reducing particulates and improving efficiency, and temperature control of metal voltage reference plate (18) improves process chamber (40) cleaning.

8 Claims, 6 Drawing Sheets

VARYING MULTIPOLE PLASMA SOURCE

CROSS REFERENCES TO RELATED APPLICATIONS

The invention of this application is an improvement on the invention of my U.S. Pat. No. 5,435,881, granted Jul. 25, 1995.

BACKGROUND—FIELD OF THE INVENTION

This invention relates to plasma sources used in processing semiconductor wafers or similar workpieces, specifically to plasma sources using multiple varying magnetic poles, with improvements relating to gas flow, magnetic pole positioning, and differential electrode driving.

BACKGROUND—DESCRIPTION OF PRIOR ART

Ogle, in U.S. Pat. No. 5,435,881, shows the use of multiple radio frequency varying magnetic poles adjacent to one or more dielectric windows to generate varying magnetic fields which are coupled into a partially evacuated process chamber. Each varying magnetic pole has opposite instantaneous polarity to all adjacent varying magnetic poles, so that the resulting varying magnetic fields extend between each varying magnetic pole and the adjacent varying magnetic poles. Thus for a square grid of varying magnetic poles, each varying magnetic pole away from the edge of the grid has varying magnetic fields extending to the four adjacent opposite polarity varying magnetic poles.

Hamamoto et al, in U.S. Pat. No. 5,261,962, FIG. 7, shows the use of multiple windows 23b with a single antenna type varying magnetic source 24b for each window, to couple energy into a plasma inside a partially evacuated chamber 21b.

Barnes, in U.S. Pat. No. 5,589,737, FIG. 13C, shows the use of multiple windows 320 to couple energy from several arrangements of straight conductors through said windows into a plasma inside a partially evacuated chamber. The use of multiple straight conductors is shown for each dielectric window, with adjacent conductors carrying current in either the same direction or in opposite directions.

Ogle, in U.S. Pat. No. 4,871,421, shows the use of equal and opposite polarity varying voltages applied to the wafer electrode and the opposite electrode to both generate a medium pressure plasma and to reduce the voltage between the plasma and the chamber walls.

OBJECTS AND ADVANTAGES

Accordingly, the primary object and advantage of my invention is to provide methods for improving plasma process efficiency and nonuniformity in a varying magnetic multipole plasma source by adjusting the positioning of the radio frequency magnetic poles, improving process gas flow, and reducing the voltage between the plasma and the chamber walls.

Previous magnetically coupled planar plasma sources tend to generate nonuniform plasmas because of a combination of plasma generation nonuniformities and nonuniform gas flow. In particular, planar magnetically coupled plasma sources using a single dielectric window typically have both gas inlets and exhaust gas outlets surrounding the workpiece electrode, so that some of the process gas bypasses the wafer, going directly from the gas inlet to the exhaust gas outlet. One approach to reduce this process gas bypass is to increase the spacing between the workpiece and the dielectric window which passes the varying magnetic field to generate the plasma. By increasing this distance the spacing between the gas inlet and exhaust gas outlet can also be increased.

However, this increased spacing between the workpiece and the dielectric window also increases the chamber volume and thus pumping time, as well as reducing the energy efficiency by increasing the distance between the plasma generation region and the workpiece.

Accordingly, one purpose of this invention is to provide a radial flow of gas outward from near the center of the wafer to an exhaust outlet surrounding the wafer, with provisions for adjusting the plasma generation uniformity by adjusting the positions of the multiple radio frequency magnetic poles.

An additional purpose is to decrease the ion flow from the plasma to the chamber walls. This reduction in ion flow is accomplished by reducing the radio frequency voltage between the plasma and the chamber walls, which also reduces the direct current voltage between the plasma and the chamber walls, and thus the ion accelerating voltage from the plasma to the chamber walls.

An additional purpose is to provide temperature control to the upper surface of the process chamber, to aid in chamber cleaning, especially for that portion of the interior of the chamber above the workpiece.

REFERENCE NUMERALS

Figure 1:
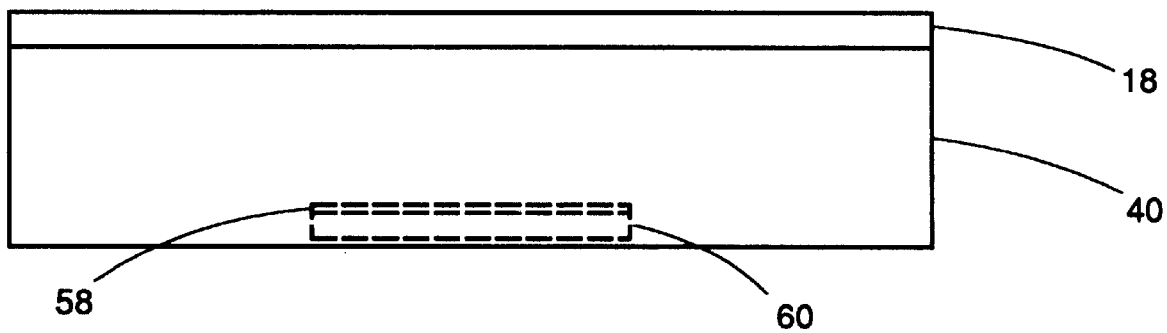
FIG. 1 is an elevational view showing a metal voltage reference plate which forms the top of a partially evacuated process chamber containing process gases and a workpiece to be processed.

10 varying magnetic poles
12 varying magnetic field
18 metal voltage reference plate
20 rounded oblong holes
22 two-pole rounded oblong dielectric windows
30 coil
32 U shaped ferromagnetic core
34 gas dispersion holes
35 gas diffuser bolt
36 gas inlet hole
38 O ring seal
40 process chamber
50 U shaped ferromagnetic layers
52 magnetic field relative direction arrows
54 free electron force relative direction arrows
56 two bus bars
58 workpiece
60 workpiece electrode
62 differential radio frequency power source

SUMMARY

In a plasma source using multiple radio frequency varying magnetic poles, providing process nonuniformity and particulate improvement by using a metal voltage reference plate to control the direction of electrical fields inside the chamber, a gas diffuser to provide gas flow across the workpiece, vertical position adjustment of the individual varying magnetic poles for fine process nonuniformity correction, chamber top temperature control, and differential radio frequency drive between said metal voltage reference plate and the wafer electrode.

PREFERRED EMBODIMENT—DESCRIPTION

FIG. 1 is an elevational view of partially evacuated process chamber 40, with metal voltage reference plate 18 forming the top, and containing process gases and workpiece 58 to be processed, mounted on workpiece electrode 60.

Figure 2A:
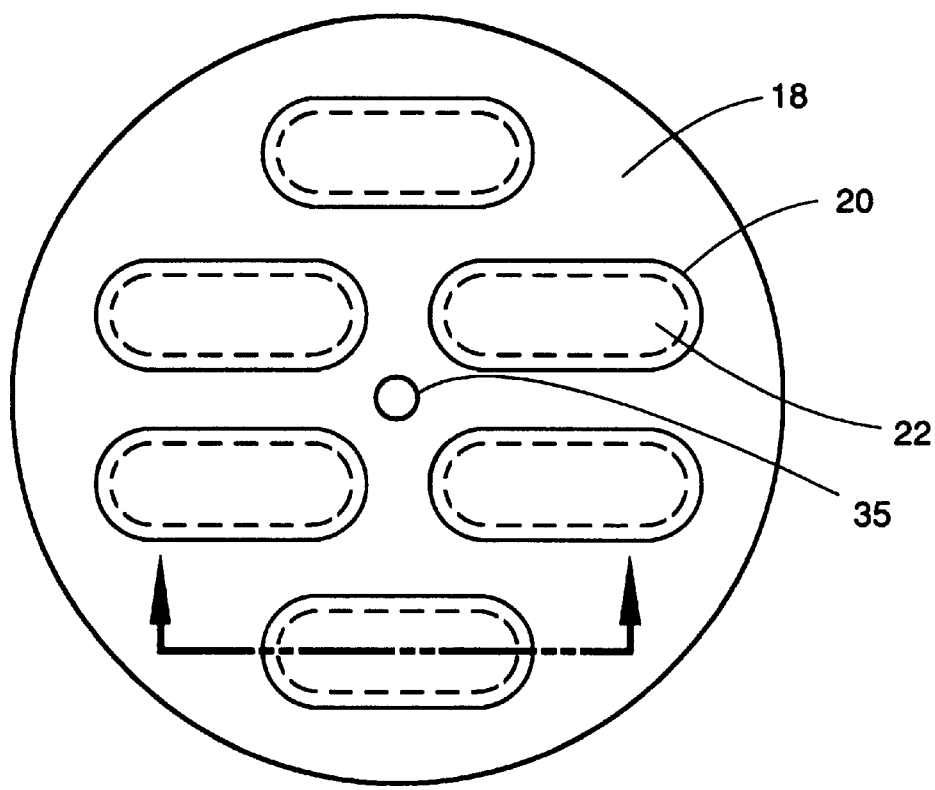
FIG. 2A is a plan view of a metal voltage reference plate with a center gas inlet diffuser and six rounded oblong holes, with a two-pole dielectric window mounted in each of the rounded oblong holes.
Figure 2B:
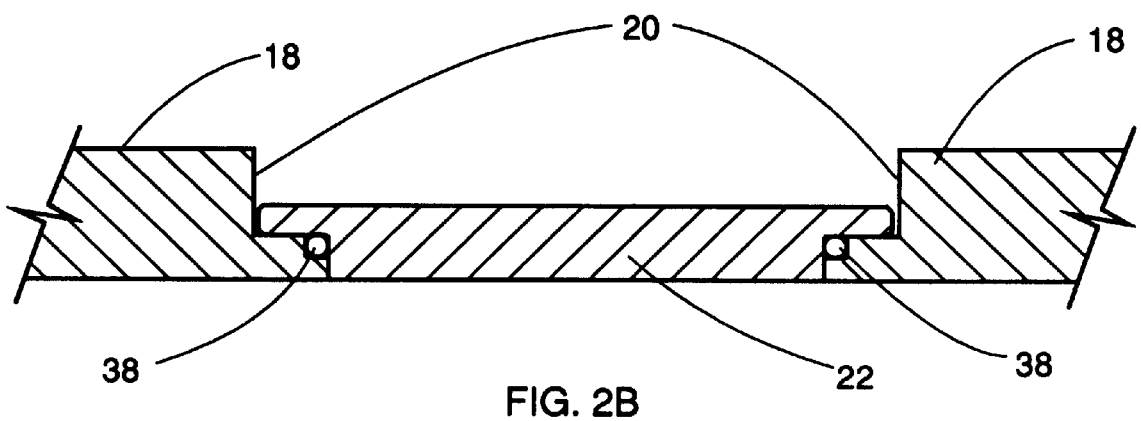
FIG. 2B is a sectional view of FIG. 2A, showing how a two-pole rounded oblong dielectric window fits into a rounded oblong hole in the metal reference voltage plate, with an O ring compressed between the two-pole rounded oblong dieletric window and the metal reference plate, to provide a gas tight seal.

FIG. 2A is a plan view of metal voltage reference plate 18, with six rounded oblong holes 20 through metal voltage reference plate 18, and two-pole rounded oblong dielectric windows 22 mounted in all six rounded oblong holes 20. A gas diffuser bolt 35 screws into the bottom of a threaded hole in the center of metal voltage reference plate FIG. 2B is a sectional view of FIG. 2A, showing one of two-pole rounded oblong dielectric windows 22 mounted in one of rounded oblong holes 20 in metal voltage reference plate 18. O ring seal 38 provides a gas tight seal.

Figure 2C:
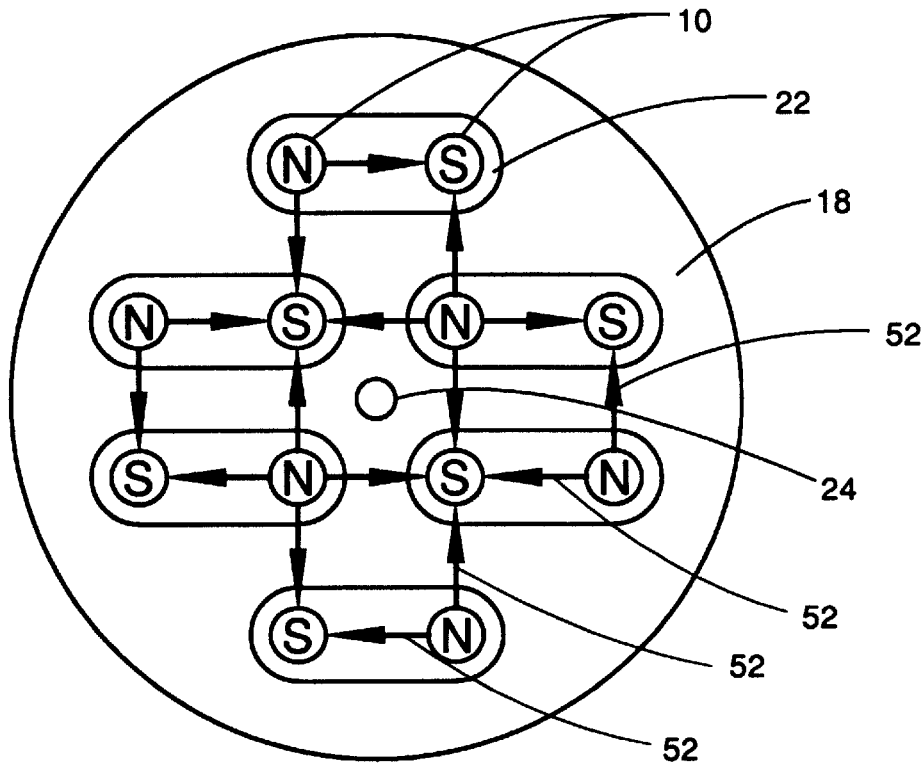
FIG. 2C is a plan view of the metal voltage reference plate of FIG. 2A, with indications of the positioning and phase relationships between the varying magnetic poles that couple varying magnetic fields through the metal voltage reference plate into the chamber, thus generating the plasma.

FIG. 2C is the plan view of FIG. 2A, showing two opposite polarity varying magnetic poles 10 mounted in proximity to and near the ends of each of the two-pole rounded oblong dielectric windows 22. Each of the varying magnetic poles 10 is marked N for north or S for south, to indicate the instantaneous magnetic pole phase relationships. The two dimensional spacings between each of the varying magnetic poles 10 and each of the adjacent opposite polarity varying magnetic poles 10 is approximately equal. Thus each of the varying magnetic poles 10 is equally spaced to either two or four opposite polarity varying magnetic poles 10. The relative direction and phase of each varying magnetic field between opposite polarity varying magnetic poles 10 is indicated by magnetic field relative direction arrows 52.

Figure 2D:
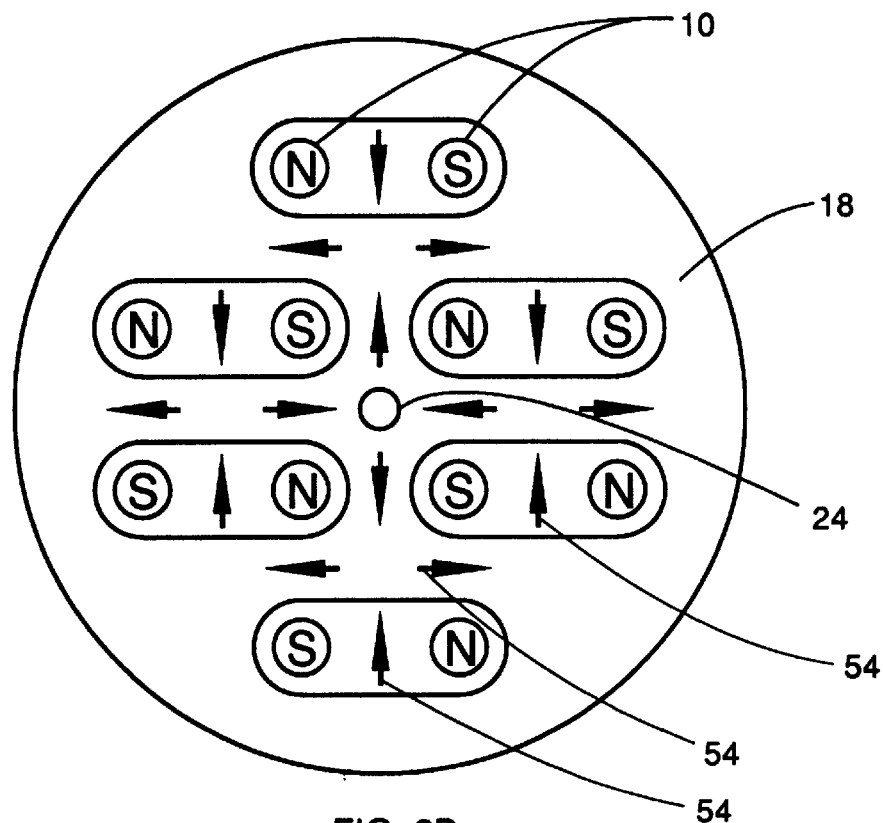
FIG. 2D is a plan view of the metal voltage reference plate of FIG. 2C, with indications of the relative directions of the forces applied to free electrons caused by the varying magnetic fields between the varying magnetic poles.

FIG. 2D is the plan view of FIG. 2C, with the phase relationship of the relative instantaneous force on free electrons caused by each varying magnetic field 12 in FIG. 2C indicated by free electron force relative direction arrows 54.

As can be seen, free electron force relative direction arrows 54 are symmetrical and opposing in each metal area of metal voltage reference plate 18 between rounded oblong holes 20, with the result that there is only negligible eddy current electron flow in metal voltage reference plate 18, even with large varying magnetic fields extending between adjacent opposite polarity varying magnetic poles 10 through parts of metal voltage reference plate 18. Thus, metal voltage reference plate 18 does not interfere with each varying magnetic field 12 between adjacent varying magnetic poles 10.

Measurement with varying magnetic field pickup loops confirm the absence of interference from metal voltage reference plate 18 on each varying magnetic field 12.

The primary function of metal voltage reference plate 18 is to provide a reference electric field surface parallel to workpiece 58, so that ion accelerating electrical fields will be perpendicular to workpiece 58. In order to achieve this perpendicular ion accelerating electric field condition, the area of the two-pole rounded oblong dielectric windows 22 units should be minimized. This can be achieved by using small windows, with ample metal area in metal voltage reference plate 18. While more than two opposite polarity varying magnetic poles 10 can be placed on each window, the resulting window area would be unnecessarily increased.

Another advantage of using metal voltage reference plate 18 is that, by using electrical insulation between metal voltage reference plate 18 and process chamber 40, either radio frequency voltages or a combination of radio frequency and direct current voltages can be applied to metal voltage reference plate 18 to influence conditions in the plasma.

Another advantage of using metal voltage reference plate 18 is that, by using thermal insulation between metal voltage reference plate 18 and process chamber 40, temperature control means applied to metal voltage reference plate 18 can result in rapid and uniform temperature control of metal voltage reference plate 18.

Another advantage of using metal voltage reference plate 18 in combination with two-pole rounded oblong dielectric windows 22 is that for a large process chamber 40, metal voltage reference plate 18 can be made as thick as is structurally desirable without any plasma generation disadvantage.

Another advantage of using metal voltage reference plate 18 is the ease of mounting one or more units of gas diffuser bolt 35 in metal voltage reference plate 18 for introducing process gases into the process chamber.

Figure 3A:
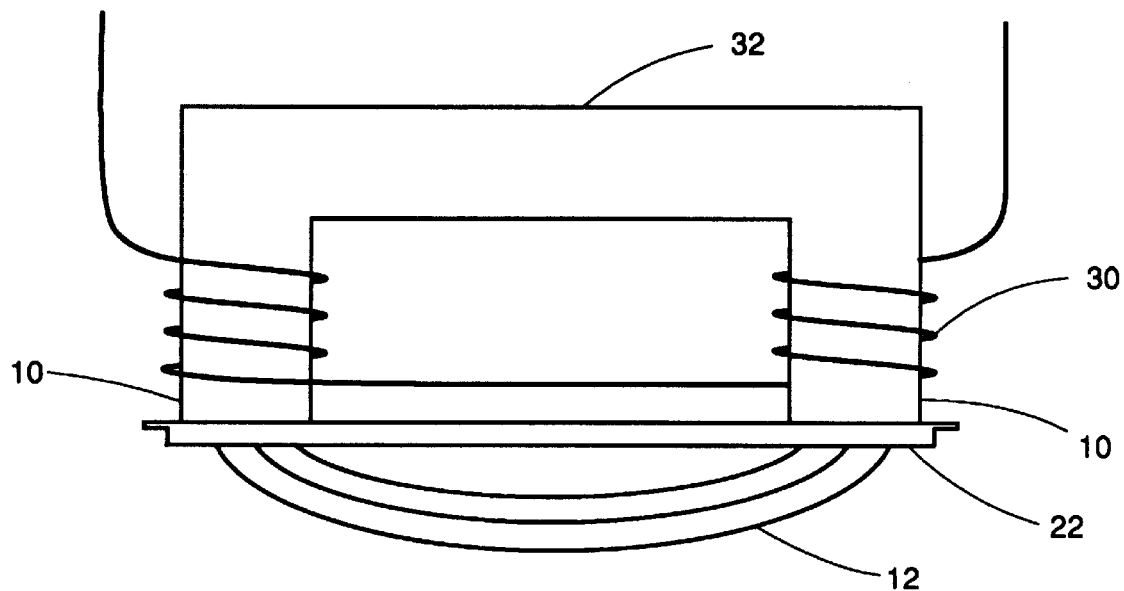
FIG. 3A is an elevational view of two opposite polarity magnetic poles formed by coils wound around the legs of a U shaped ferromagnetic core placed adjacent to a two-pole dielectric window, with an indication of the shape of the magnetic field extending through the dielectric window, resulting from current flowing through the coils.

FIG. 3A is an elevational view of two opposite polarity varying magnetic poles 10 formed by coil 30 wound around the legs of U shaped ferromagnetic core 32, placed adjacent to two-pole rounded oblong dielectric window 22. Lines representing varying magnetic field 12 extend between opposite polarity varying magnetic poles 10 through two-pole rounded oblong dielectric window 22.

Figure 3B:
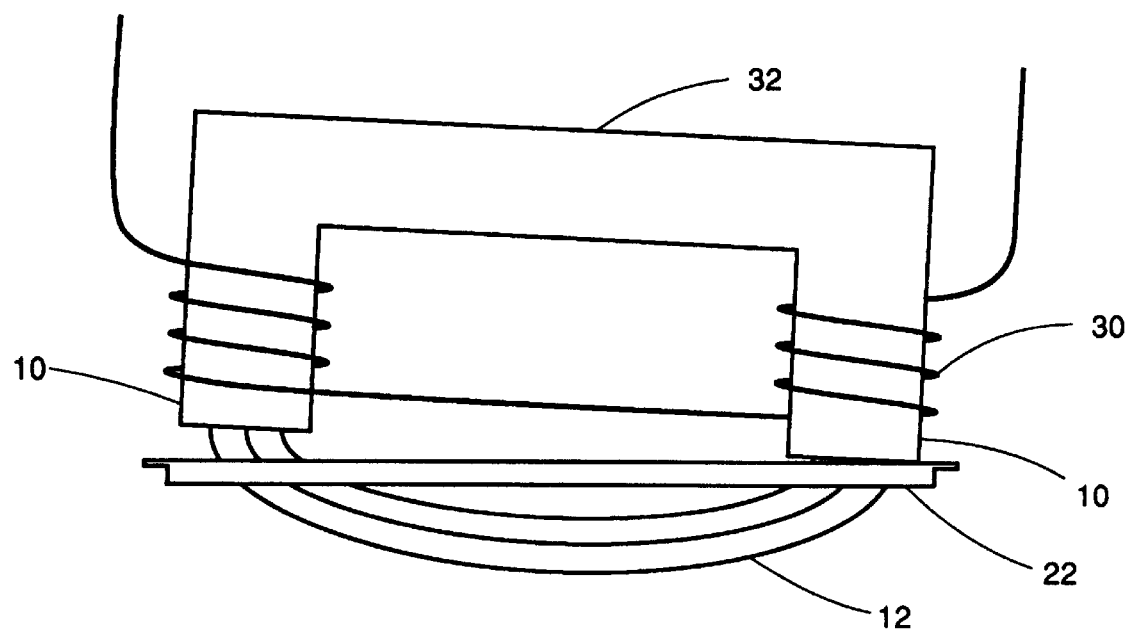
FIG. 3B is an elevational view of the two opposite polarity magnetic poles of FIG. 3A, with one end of the U core and coil raised above the dielectric window, and an indication of the resulting reduced magnetic field extending below the dielectric window.

FIG. 3B is an elevational view of the two opposite polarity varying magnetic poles 10 of FIG. 3A, with one end of U shaped ferromagnetic core 32 and coil 30 raised above two-pole rounded oblong dielectric window 22, with an indication of the resulting decreased varying magnetic field 12 extending through two-pole rounded oblong dielectric window 22. By raising an end of a U shaped ferromagnetic core 32 in an area of excessive plasma density, process uniformity can be greatly improved.

Figure 4A:
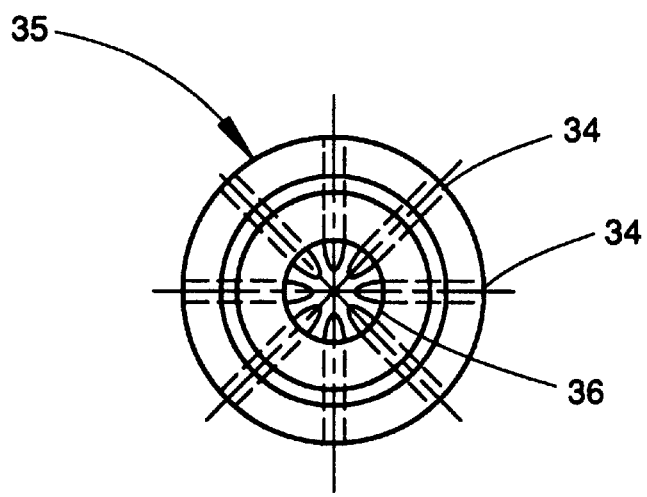
FIG. 4A is a plan view of a gas diffuser bolt, showing the gas dispersion holes.

FIG. 4A is a plan view of gas diffuser bolt 35, showing gas inlet hole 36 connecting with gas dispersion holes 34.

Figure 4B:
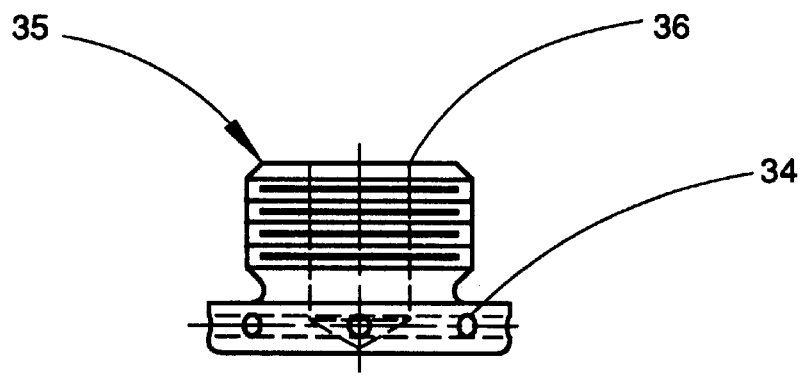
FIG. 4B is an elevational view of the gas diffuser bolt of FIG. 4A, showing the gas dispersion holes connecting to the main gas inlet hole.

FIG. 4B is an elevational view of gas diffuser bolt 35, showing gas inlet hole 36 and gas dispersion holes 34.

Figure 5:
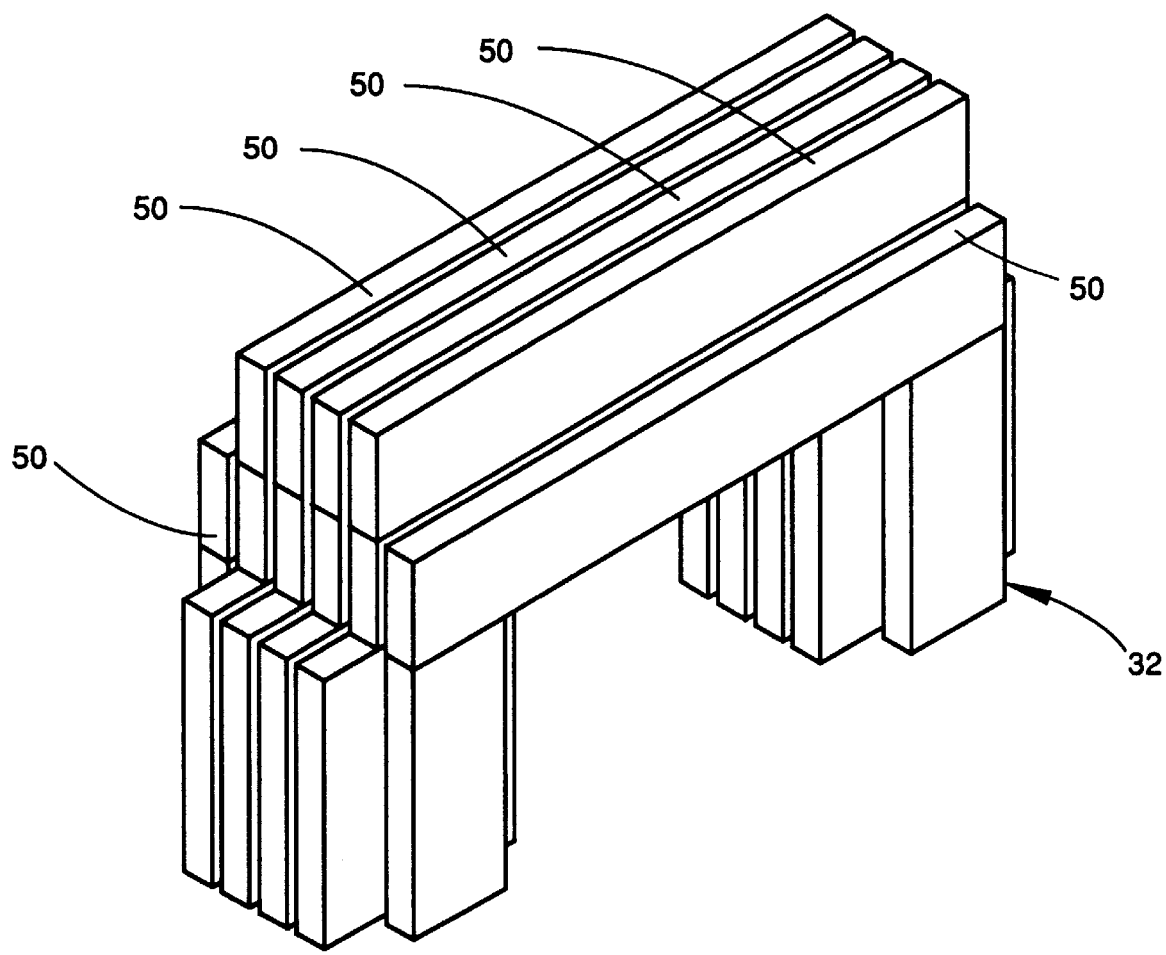
FIG. 5 is an perspective view showing the construction of a U shaped ferromagnetic core, with provisions for cooling by air flow through spaces in the U shaped ferromagnetic core.

FIG. 5 is a perspective view of U shaped ferromagnetic core 32 showing how ferrite strips are assembled into U shaped ferromagnetic layers 50, which are further assembled into U shaped ferromagnetic core 32, with cooling spaces for air or other fluids provided between U shaped ferromagnetic layers 50.

Figure 6:
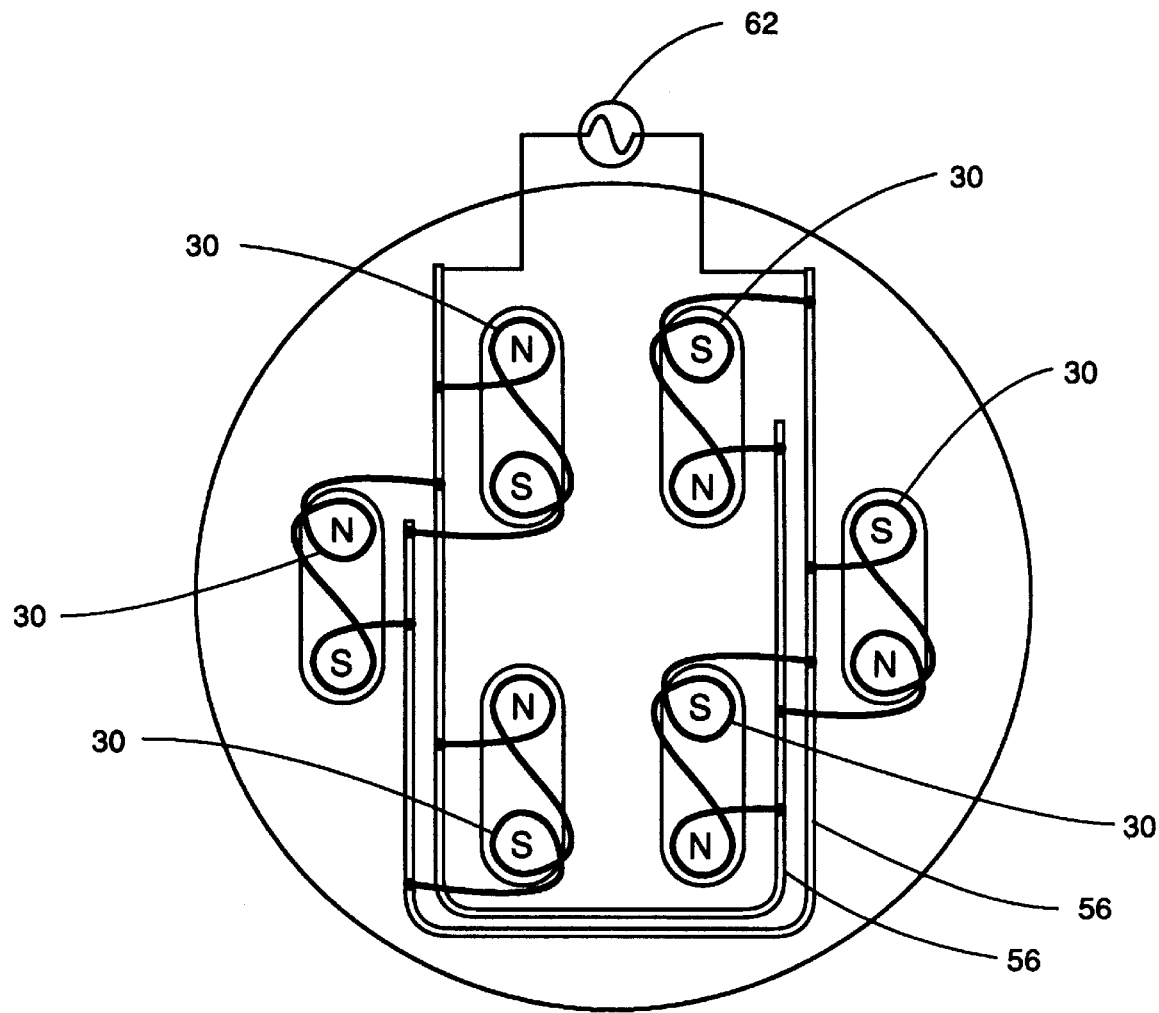
FIG. 6 is a plan view showing a prefered bus bar arrangement for differential driving of the coils used to generate opposite polarity adjacent varying magnetic poles.

FIG. 6 is a plan view of metal voltage reference plate 18 showing a preferred electrical arrangement of six units of coil 30, with each coil 30 connected in parallel between two bus bars 56, and the winding directions of each coil 30 arranged for ease of connection to two bus bars 56, for opposite polarity of adjacent varying magnetic poles 10, with approximately equal length of current flow for each coil 30 through two bus bars 56. Differential radio frequency power source 62 provides equal and opposite polarity voltages to two bus bars 56.

PREFERRED EMBODIMENT—OPERATION

The desired combination of gases is fed into process chamber 40 through gas diffuser bolt 35, which is mounted from the bottom in the center of metal voltage reference plate 18. Radio frequency power is applied in parallel to each coil 30, each of which is wound around the legs of U shaped ferromagnetic core 32, forming opposite polarity pairs of varying magnetic poles 10. The resulting rectangular varying magnetic field 12 grid extends equally through metal voltage reference plate 18 and two-pole rounded oblong dielectric windows 22 into process chamber 40, accelerating free electrons and generating the desired plasma.

Process results are evaluated either by examining processed wafers or by measuring plasma characteristics, and the areas where the plasma density is too great are determined.

Each of the areas where the plasma density is too great is reduced in varying magnetic field magnitude by raising the adjacent varying magnetic pole 10, by raising one end of either coil 30 or both coil 30 and the corresponding end of U shaped ferromagnetic core 32.

The above steps are repeated until satisfactory plasma nonuniformity is achieved.

OTHER EMBODIMENTS

Bus Bars for Core Coils—Description

It is desirable to have all of the energy coupled into the plasma from each coil 30 come from varying magnetic fields accelerating free electrons parallel to workpiece 58. Any electrical field energy coupled from each coil 30 would result in free electron energy perpendicular to workpiece 58, and could result in excessive nonuniform electrical fields on workpiece 58, with currents flowing across workpiece 58.

The best method for assuring minimum radio frequency electric fields from each coil 30 is to wind coil 30 with the center adjacent to two-pole rounded oblong dielectric windows 22 and to use differential radio frequency voltage drive to the ends of each coil 30. FIG. 6 shows a bus bar arrangement with differential radio frequency power source 62 driving two bus bars 56, with each coil 30 connected in parallel between two bus bars 56. The coil 30 winding directions shown in FIG. 6 provide easy connections for each coil 30 to two bus bars 56, with substantially equal length current paths through two bus bars 56 for each coil 30.

Chamber Cleaning—Description

After some process time there is a tendency to accumulate debris from the process to the surfaces of the process chamber. If excessive debris accumulates, it may fall off as particles, which can result in damage to the workpiece. One method of cleaning this debris is to open the chamber and scrub off the debris from the process chamber. Another method is to run a plasma cleaning process, during which dummy workpieces are used, and operating conditions, including gases, pressures and power levels are designed to attack this debris. A third method is to apply a tape, typically of Kapton, over the bottom of metal voltage reference plate 18, including two-pole rounded oblong dielectric windows 22, but not covering gas diffuser bolt 24, with the tape punctured wherever there is a gap which could result in a virtual leak, such as the intersection between metal voltage reference plate 18 and two-pole oblong dielectric window 22.

Chamber Cleaning—Operation

Plasma processes are conducted until excessive debris accumulates on the tape layer covering the bottom of metal voltage reference plate 18. The tape layer, with the debris, is removed and replaced with a new tape layer.

Differential Electrode Driving—Description

For some etching processes, such as oxides or refractory metals, high ion kinetic energies are required. These high ion kinetic energies require high direct current bias voltages between the plasma and workpiece 58. These high direct current bias voltages are generated from radio frequency voltages of high amplitude between the plasma and workpiece electrode 60. Free electrons in the plasma are accelerated to workpiece 58 during the positive peaks of radio frequency voltage on workpiece electrode 60, resulting in a direct current negative charge on workpiece 58, while the plasma ions are so much more massive that they just quiver at the radio frequency and are accelerated to workpiece 58 electrode over many radio frequency cycles by the direct current bias voltage.

Since there isn't a consistent direct current path between workpiece 58 and workpiece electrode 60, a direct current blocking capacitor is often placed in series with workpiece electrode 60. This series blocking capacitor can take the form of a physical capacitor or a dielectric layer used in an electrostatic clamp. Since there is no direct current flow through workpiece 58, the positive ion current flowing from the plasma to workpiece 58 is equal to the average free electron current flowing from the plasma to workpiece 58.

Similarly, it is desired to control any direct current flow from metal voltage reference plate 18 to the plasma, so a capacitor is also placed in series with metal voltage reference plate 18. If it is desired to provide a direct current flow through metal voltage reference plate 18, the plasma, and process chamber 40 walls, a current source can be used between metal voltage reference plate 18 and process chamber 40 walls.

If the radio frequency voltage used to generate the direct current bias voltage is applied only to workpiece electrode 60 or only to metal voltage reference plate 18, there will be large radio frequency voltages between the plasma and the chamber walls. This can result in significant positive direct current bias voltage on the plasma relative to the chamber walls, which causes an unnecessarily large flow of positive ions from the plasma to the chamber walls, increasing the debris on the chamber walls and dissipating radio frequency power without providing any advantage. If both workpiece electrode 60 and metal voltage reference plate 18 are driven by a radio frequency bias voltage with the appropriate amplitude and opposite phase, the radio frequency voltage between the plasma and the chamber walls can be reduced to near zero, reducing the direct current voltage between the plasma and the chamber walls. Thus a large direct current ion accelerating voltage can be generated between the plasma and workpiece 58, while only a small direct current ion accelerating voltage is generated between the plasma and process chamber 40 walls.

Since the area of metal voltage reference plate 18 will, in general, be greater than the area of workpiece 58, the capacitance between the plasma and metal voltage reference plate 18 will be greater than the capacitance between the plasma and workpiece 58. Thus, in order to have minimum voltage between the plasma and the walls of process chamber 40, the alternating current voltage between metal voltage reference plate 18 and process chamber 40 will be significantly less than the alternating current voltage between workpiece electrode 60 and process chamber 40. Since the capacitances are determined by the thicknesses of the depletion regions (dark spaces) between the plasma and the electrodes as well as the areas of the electrodes, it is desirable to be able to measure the radio frequency voltage between the plasma and the walls of process chamber 40, and to adjust the ratio of opposite phase voltages to metal voltage reference plate 18 and workpiece electrode 60 for minimum plasma voltage relative to process chamber 40.

Differential Electrode Driving—Operation

One method to provide adjustable ratio differential electrode drive is to use a single radio frequency match circuit followed by an adjustable ratio differential transformer, with equal length coaxial cables extending from the two outputs of this adjustable ratio differential transformer to workpiece electrode 60 and metal voltage reference plate 18.

Another method is to use separate radio frequency matches for workpiece electrode 60 and metal voltage reference plate 18, with differential adjustment of the match loading controls used to provide the desired ratio of radio frequency voltages between electrodes, while common adjustment of the match tuning controls adjusts for proper match to the input cable impedance for both matches. The radio frequency voltages at both electrodes can be measured and compared to assure the desired voltage ratio and phase relationship.

Large Area Plasma Sources—Description

Large area plasma sources such as are used for processing flat panel displays can provide more uniform gas flow across workpiece 58 by having multiple units of gas diffuser bolt 35 spaced around metal voltage reference plate 18.

Heated Metal Voltage Reference Plate—Description

For some applications it is desirable to control the temperature of chamber walls, for example to influence the rate at which materials are deposited on or cleaned from the chamber walls. By varying the temperature of metal voltage reference plate 18 it is possible to either cause deposits to attach to metal voltage reference plate 18 more securely or to clean more rapidly during a plasma condition. Electrical heating elements can be attached to the top of metal voltage reference plate 18 for heating, or both heating and cooling can be achieved through use of temperature controlled fluid flowing through tubes or other flow channels in good thermal contact with metal voltage reference plate 18. Thermal insulation between metal voltage reference plate 18 and process chamber 40 can be used to allow a much wider temperature control range, from sub freezing to the temperatures used for self cleaning ovens.

Heated Metal Voltage Reference Plate—Operation

The temperature of metal voltage reference plate 18 is set to a value that increases adhesion of deposits to metal voltage reference plate 18 during workpiece plasma processing. When chamber cleaning is desired, the temperature of metal voltage reference plate 18 is set to a value that enhances the cleaning of deposits from metal voltage reference plate 18, and a chamber cleaning process is conducted.

CONCLUSIONS, RAMIFICATIONS, and SCOPE

Accordingly, it can be seen that the use of gas diffuser bolt 35 near the center of metal voltage reference plate 18 combined with vertical adjustment of the appropriate coil 30 or combination of coil 30 and an end of U shaped ferromagnetic core 32 can provide a plasma with reduced non-uniformity in process results. In addition, the use of opposite phase radio frequency bias voltages driving metal voltage reference plate 18 and workpiece electrode 60 can result in decreased particulates and improved energy efficiency when used with a plasma generated by a varying multipole plasma source.

Thus the scope of the invention should be determined by the appended claims and their legal equivalents, rather than by the examples given.

What is claimed is:

1. A low pressure plasma source, comprising:

a process chamber for enclosing process gases at reduced pressures and including means for controlling gas pressure and flow, and a workpiece mounted on a workpiece electrode inside said process chamber, and a metal voltage reference plate forming a surface of said chamber, said metal voltage reference plate having two or more rounded oblong holes, and two or more rounded oblong dielectric windows mounted in said rounded oblong holes in said metal voltage reference plate with means for providing gas tight seals between said rounded oblong dielectric windows and said metal voltage reference plate, and two or more pairs of opposite polarity varying magnetic poles, with each pair of said opposite polarity varying magnetic poles mounted in proximity to one of said rounded oblong dielectric windows, such that varying magnetic fields between said opposite polarity magnetic poles couple through said rounded oblong dielectric windows and generate a plasma inside said process chamber.

2. The plasma source of claim 1, further including:

One or more gas diffusers mounted in said metal voltage reference plate, with each of said gas diffusers having multiple gas introduction holes which introduce process gases into said process chamber with a velocity component parallel to the surface of said metal voltage reference plate, with each said gas diffuser either integral with said metal voltage reference plate or in the form of a gas diffuser bolt mounted in a hole in said metal voltage reference plate.

3. The plasma source of claim 1, further including:

means for driving said workpiece electrode with a radio frequency voltage of the same frequency as the frequency of said opposite polarity varying magnetic poles, and means for establishing a desired phase relationship between said radio frequency voltage and said varying magnetic poles.

4. The plasma source of claim 1, further including:

electrical insulation between said metal voltage reference plate and said process chamber, and means for driving said metal voltage reference plate with a radio frequency voltage relative to said chamber.

5. The plasma source of claim 1, further including:

electrical insulation between said metal voltage reference plate and said chamber, and electrical insulation between said workpiece electrode and said chamber, and means for driving both said workpiece electrode and said metal voltage reference plate with opposite polarity radio frequency voltages relative to said chamber.

6. The plasma source of claim 1, further including:

electrical insulation between said metal voltage reference plate and said chamber, and electrical insulation between said workpiece electrode and said chamber, and means for measuring the radio frequency voltage between said plasma and said chamber, and means for driving both said workpiece electrode and said metal voltage reference plate with opposite polarity and variable ratio radio frequency voltages between said workpiece electrode and said process chamber and between said metal voltage reference plate and said process chamber, with said variable ratio voltages adjusted for satisfactorily low radio frequency voltage between said plasma and said process chamber.

7. The plasma source of claim 1, further providing that said pairs of opposite polarity varying magnetic poles consist of varying electric current flowing through coils wound around the ends of a U shaped ferromagnetic core, with said U shaped ferromagnetic core comprised of multiple U shaped layers of thin ferromagnetic material, separated by spaces to allow the flow of cooling fluids.

8. The plasma source of claim 1, further including:

thermal insulation between said metal voltage reference plate and said process chamber, and means for controlling the temperature of said metal voltage reference plate.

* * * * *